(12) United States Patent
Madurawe

(10) Patent No.: US 7,709,314 B2
(45) Date of Patent: May 4, 2010

(54) SEMICONDUCTOR SWITCHING DEVICES AND FABRICATION METHODS

(75) Inventor: Raminda Udaya Madurawe, Sunnyvale, CA (US)

(73) Assignee: Tier Logic, Inc., Santa Clara, CA (US)

( * ) Notice: Subject to any disclaimer, the term of this patent is extended or adjusted under 35 U.S.C. 154(b) by 0 days.

(21) Appl. No.: 12/207,110

(22) Filed: Sep. 9, 2008

(65) Prior Publication Data
US 2009/0004791 A1 Jan. 1, 2009

Related U.S. Application Data

(60) Division of application No. 11/042,362, filed on Jan. 26, 2005, which is a continuation of application No. 10/413,809, filed on Apr. 14, 2003, now Pat. No. 6,855, 988.

(60) Provisional application No. 60/393,763, filed on Jul. 8, 2002, provisional application No. 60/397,070, filed on Jul. 22, 2002, provisional application No. 60/400,007, filed on Aug. 1, 2002, provisional application No. 60/402,573, filed on Aug. 12, 2002, provisional application No. 60/449,011, filed on Feb. 24, 2003.

(51) Int. Cl.
*H01L 21/8238* (2006.01)
(52) U.S. Cl. ............... 438/199; 257/347; 257/E21.701
(58) Field of Classification Search ............... 438/199; 257/347, E21.701
See application file for complete search history.

(56) References Cited

U.S. PATENT DOCUMENTS 5,781,031 A 7/1998 Bertin

| | | | | |
|---|---|---|---|---|
| 6,037,196 A | * | 3/2000 | Schwalke | ............... 438/151 |
| 6,600,173 B2 | * | 7/2003 | Tiwari | .................. 257/74 |
| 2001/0045559 A1 | * | 11/2001 | Yamazaki et al. | ............ 257/66 |
| 2002/0177260 A1 | * | 11/2002 | Matsumoto | ............... 438/154 |
| 2004/0178819 A1 | | 9/2004 | New | |
| 2006/0195729 A1 | | 8/2006 | Huppenthal | |

OTHER PUBLICATIONS

Chen Dong et al., "3-D nFPGA: A reconfigurable architecture for 3-D CMOS/Nanomaterial Hybrid Digital Circuits", IEEE Trans. Circuits and Systems, vol. 54, No. 11, Nov. 1, 2007 (pp. 2489-2501).

* cited by examiner

*Primary Examiner*—Phat X Cao
(74) *Attorney, Agent, or Firm*—Tran & Associates

(57) ABSTRACT

Methods of fabricating low temperature semiconductor thin film switching devices are described. A method includes: forming one or more metal lines on a substrate; forming a conductive contact to a said metal line thru an insulator layer above the metal lines; forming a thin film N-type and P-type conducting transistor pair having: a contiguous amorphous silicon first geometry above the insulator layer, said first geometry including an N-type transistor region, a P-type transistor region, and a common region between the transistor regions fully covering the contact; and a gate dielectric layer above the first geometry; and a contiguous amorphous silicon second geometry above the gate dielectric layer including transistor regions that cross over the first geometry transistor regions; forming a silicide of first and second amorphous silicon geometry surfaces with a deposited metallic material, the silicided surfaces including: said second geometry surface; and said first geometry surface not covered by the second geometry, which includes the surface of the region covering the contact; depositing an insulating material; and forming conductive contacts and top metal interconnects.

19 Claims, 7 Drawing Sheets

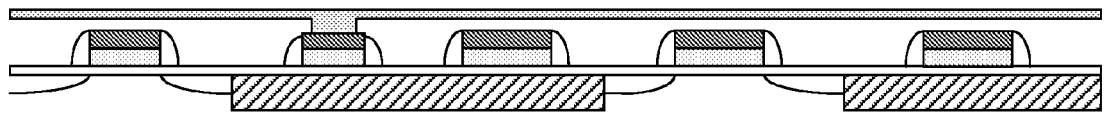
Fig - 11.1
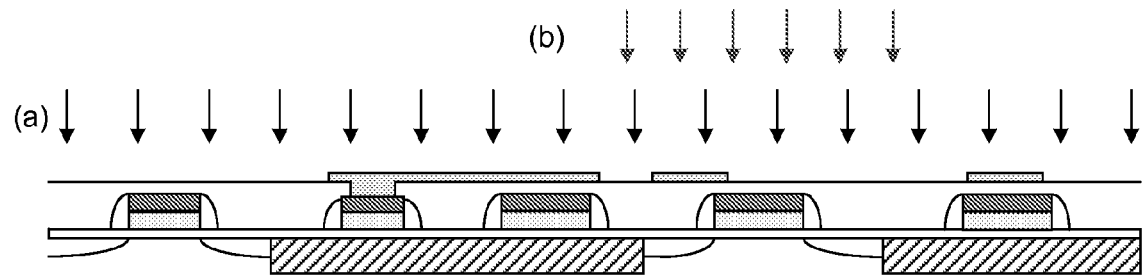
Fig - 11.2
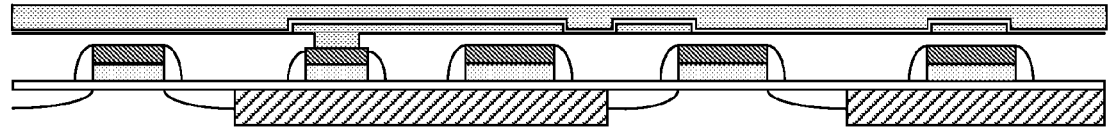
Fig - 11.3
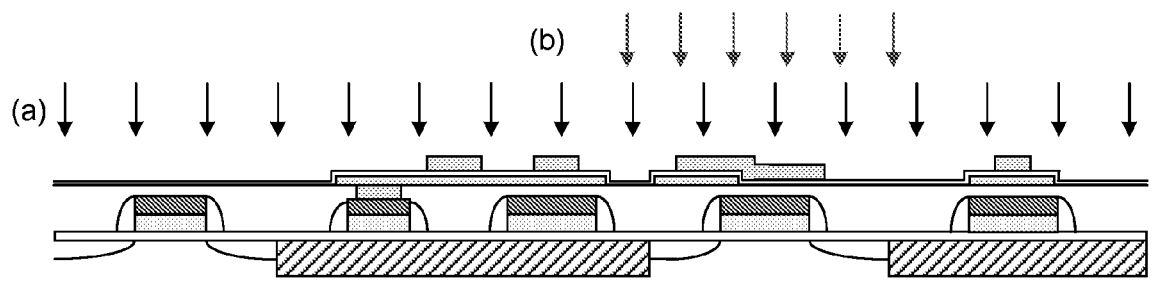
Fig - 11.4

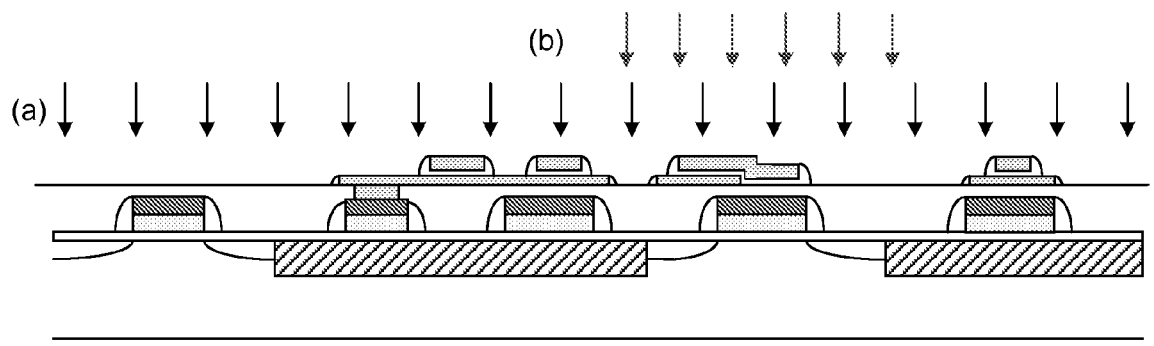
Fig - 11.5
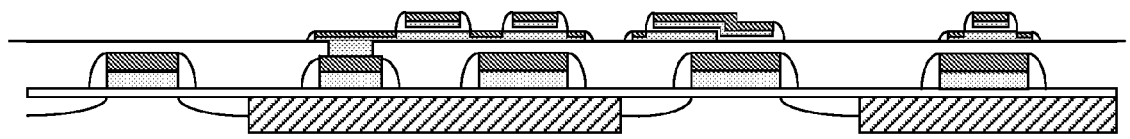
Fig - 11.6
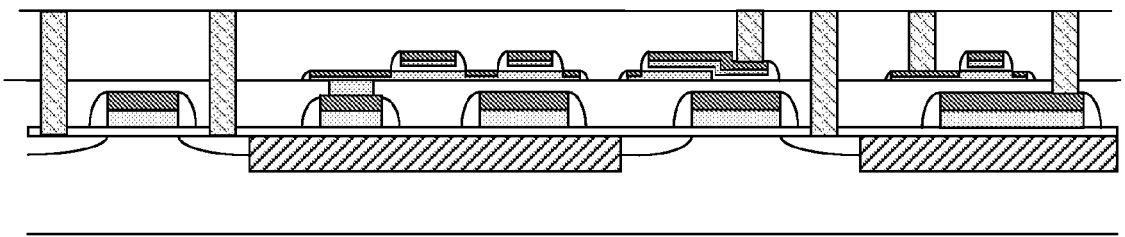
Fig - 11.7

SEMICONDUCTOR SWITCHING DEVICES AND FABRICATION METHODS

This application is a division of application Ser. No. 11/042,362 filed on Jan. 26, 2005, which is a continuation of application Ser. No. 10/413,809 filed on Apr. 14, 2003, now U.S. Pat. No. 6,855,988, which claims priority from Provisional Application Ser. No. 60/393,763 filed on Jul. 8, 2002, Provisional Application Ser. No. 60/397,070 filed on Jul. 22, 2002, Provisional Application Ser. No. 60/400,007 filed on Aug. 1, 2002, Provisional Application Ser. No. 60/402,573 filed on Aug. 12, 2002, and Provisional Application Ser. No. 60/449,011 filed on Feb. 24, 2003, all of which lists as inventor Mr. R. U. Madurawe and the contents of which are incorporated-by-reference. This application is also related to application Ser. No. 10/912,697 filed on Aug. 6, 2004, which is a division of application Ser. No. 10/413,809 and lists as inventor Mr. R. U. Madurawe, the contents of which are incorporated-by-reference.

This application is related to application Ser. Nos. 10/267,483, 10/267,484, and 10/267,511 now U.S. Pat. No. 6,747,478, all of which were filed on Oct. 8, 2002 and lists as inventor Mr. R. U. Madurawe, the contents of which are incorporated-by-reference.

This application is further related to application Ser. No. 10/413,808 filed on Apr. 14, 2003, and application Ser. No. 10/979,024 filed on Nov. 2, 2004, all of which lists as inventor Mr. R. U. Madurawe, the contents of which are incorporated-by-reference.

BACKGROUND

The present invention relates to semiconductor switching devices. Specifically, it relates to switching devices fabricated with very thin semiconductor films.

A switching device includes a four terminal device, which couples its output node to any one of two available voltage sources based on an input level. A three terminal switch in electrical applications is a light bulb switch: output connects to power when the input is on, and open circuit when the input is off. Common 4 terminal switches in the semiconductor industry include single input inverters and 2:1 MUXs. The inverter and MUX output switches between two voltage levels based on the input voltage level. In the inverter, the output voltage has an opposite polarity to the input voltage. Inverters can be classified into three types: full CMOS inverter, resistor load inverter, and thin film PMOS load inverter. A Depletion load inverter is not commonly used in sub micron geometries. It is not discussed in detail in this disclosure. The common inverter is used for boosting signal levels, and constructing latches. A latch consists of two inverters connected back to back and allows storing digital data when the latch is powered. These latches are used to build static random access memory (SRAM) devices. Very high density SRAM memory is used in Integrated Circuits to store and access large amounts of digital data very quickly.

A switching device fabrication in single crystal Silicon (Si) has two different methods. The most popular CMOS inverter in FIG. 1 has two MOSFET transistors. Fabrication comprises a simple Logic Process flow with no special processing needed. Both transistors are located in a substrate single crystal Silicon, and have high mobilities for electron and hole conduction. This inverter area is large, standby current is negligible and the output current drive is very good. This inverter configuration is used for high cost, least power, fastest access SRAM memory, and for data buffering and high current output drivers.

In FIG. 1, the inverter contains two voltage sources 103 and 104. These are typically $V_D$ (power) and $V_S$ (ground) respectively, but do not need to be so. The switch has an input voltage 101, and an output voltage 102. A PMOS 110 is connected between voltage source 103 and output node 102, and an NMOS 120 is connected between output node 102 and voltage source 104. Both transistor gates are tied together for a common input 101. When the input is at logic 1 ($V_D$), the NMOS device is on and the PMOS device is off, connecting voltage source 104 to output 102. When the input is at logic 0 ($V_S$), the NMOS is off and PMOS is on connecting source 103 to output 102. As both NMOS and PMOS have high mobility, the current drives via the transistors are very high. The output is driven very strongly to one of the two voltage supply levels. Any deviations from these values are corrected very quickly via the conducting transistors. If $V_D$ and $V_S$ were two other voltage levels V1 and V2, the device in FIG. 1 is a 2:1 CMOS MUX with input 101 and output 102.

The CMOS inverter consumes a relatively large amount of Silicon area. FIGS. 2A and 2B show a conventional CMOS inverter fabricated using a conventional twin well process. Both PMOS and NMOS devises comprises a conducting path and a gate. In FIG. 2A, NMOS conducting path is 220, while PMOS conducting path is 210. Both NMOS and PMOS share a common gate 201. NMOS conducting path 220 is inside a P-well 230, while PMOS conducting path 210 is inside an N-well 240. PMOS source and drain diffusions 211 and 212 are P+ diffusion regions, while NMOS source and drain diffusions 214 and 213 are N+ diffusion regions. Conducting path include these source and drain diffusions. Due to potential latch-up conditions, a separation distance Y is maintained between the two conducting paths 210 and 220. Hence the two devices are constructed on two separate active geometries on the substrate 250. Both Nwell 240 and Pwell 230 are constructed on a substrate 250 of the device, which could be P-type or N-type. Latch-up arises from the P+/N-well/P-Well regions 212/240/230 and N+/P-Well/N-well regions 213/230/240 bipolar parasitic transistors near the well boundary as shown in FIG. 2B. In FIG. 2B, PMOS source 211 and body 240 are tied to $V_D$ 203, and NMOS source 213 and body 230 are tied to $V_S$ 204. In other applications, the body may be separately biased. The Pwell 230 has to be biased to the lowest potential, while the Nwell 240 has to be biased to the highest potential.

In addition to the CMOS approach, the inverter can be fabricated as a Resistor-load inverter and a TFT PMOS-load inverter. They both have the pull-up device vertically integrated and require special poly-crystalline (poly) silicon for the load device construction. The pull-up devices in FIGS. 3A and 3B are poly Silicon resistor 310, and TFT PMOS 3010 respectively, and are not built on single crystal silicon. The pull-down NMOS device conducting paths 320 and 3020 remain in single crystal silicon. The vertically integrated pull-up device allows elimination of N-wells in the substrate, and a smaller inverter construction area. Latches constructed with these inverters consume standby power as one inverter is always conducting, and the power consumption is determined by the resistor value. For 1 Meg density of latches and 1 mA standby current, a resistor value of 1 GOhms is needed. High value intrinsic poly-silicon resistors are hard to build, and TFT PMOS devices offer better manufacturability. TFT PMOS can be also used as active weak PMOS pull-up devices similar to regular PMOS in FIG. 1 to eliminate standby current. As the pull-up device 310 or 3010 drive current is very weak, these inverters cannot drive a strong logic one. These configurations of inverters are only used to build latches to construct low cost, high density, higher power, and medium access SRAM memory. Such memories need complex dual ended sense amplifiers to read the latch data.

Inverters in FIGS. 1 and 3 can be constructed with Metal-Oxide-Semiconductor-Field-Effect-Transistor (MOSFET) devices, which is a sub-class of more generic Insulated-Gate Field-Effect Transistor (IGFET). The inverter in FIG. 1 cannot be constructed with Junction Field Effect Transistors (JFET) due to the voltage restrictions on the gate as discussed below.

The MOSFET operates by conducting current between its drain and source through a conducting surface channel created by the presence of a gate voltage. FIG. 4 shows a cross section of an N-MOSFET (NMOS) conducting channel 410 with a depletion region shown shaded. In FIG. 4, an NMOS transistor body 400 is P− doped, isolating an N+ doped source region 414 and an N+ doped drain region 413. Source and drain diffusions are connected to terminals 404 and 403 respectively. The result is the formation of two N+/P− back-to-back reverse-biased diodes. For this discussion, the source 404 is assumed at zero ($V_S$). When the voltage 402 at gate 412 is zero, the N+/P− back-to-back reverse-biased diodes do not conduct and the transistor is off. There is no surface channel 410, and the body surface under insulator 405 next to gate 412 is in accumulation of majority hole carriers. The conduction path between source and drain is now substantially non-conductive. In the embodiment of FIG. 4, the gate 412 includes a salicided region 422. A spacer 420 is formed adjacent to gate 412. Source and drain salicidation is not shown in FIG. 4. When the gate voltage 402 is greater than a threshold voltage ($V_T$) of the transistor, an inversion occurs near the surface, shown by channel 410, completing an electron carrier path between the source 414 and drain 413 regions causing current flow. The conducting path now include source 414, channel 410 and drain 413 and is substantially conductive. In addition to the inversion layer, charge depletion occurs adjacent to the body region 400 due to the gate, source and drain voltages. The component of this depleted charge from the gate voltage determines the magnitude of the $V_T$. Trapped oxide charge and Silicon defects affect the $V_T$ transistor parameter. The more positive the voltage is at the gate, the stronger is the conduction. At all levels, the substrate 400 potential is kept at the lowest voltage level. In most applications, the substrate and source are held at $V_S$. Substrate can be pumped to negative voltages for special applications.

A PMOS device is analogous to an NMOS device, with the device operational polarity and doping types reversed. PMOS source is typically tied to $V_D$. A PMOS is on when the gate is at $V_S$, and off when the gate is at $V_D$. Conducting path includes a P+ doped source and drain, and a surface inversion layer in the Nwell body region. The Nwell is biased to the highest potential, and in most applications the source and Nwell are held at $V_D$.

As discussed in U.S. Pat. No. 5,537,078, conventional JFET transistors are of two main types: P-channel (PJFET) and N-channel (NJFET). In NJFET, FIG. 5, a semiconductor channel 506 which has been doped N− is positioned between two N+ diffusions 513 and 514. Conducting path includes diffusion 513, resistive channel 506 and diffusion 514. Terminals 503 and 504 are coupled to diffusions 513 and 514. The terminal supplying the majority carrier to the channel (which is the lowest potential) is designated the source (S) while the other terminal is designated the drain (D). Across the N− channel 506 there are two diffused gates which are referred to as the top gate 512 and the bottom gate 522. Those are connected to terminals 502 and 532 respectively. Each gate is doped with P+ type dopant to create two back to back P+/N− diodes. When drain and source voltages are different, the drain to source current passes entirely through the conducting N− channel 506. This current increases with higher voltage drop between the terminals, reaching a saturation value at high biases. The gates are biased to keep the gate to channel P+/N− junctions reversed biased. The reversed biased voltage creates depletion regions 510 and 520 that penetrate into the channel reducing the channel height available for current flow. The depletion regions merge at drain end 530 to cause current saturation at high drain bias. The gate voltages also control the flow of current between the source and drain by modulating the channel height. When the gate reverse bias is sufficiently large, the entire channel is pinched-off causing no current flow between drain and source. Conducting path is then substantially non-conductive. In both on and off states of a JFET, there is no current flow through the gate terminal due to reverse bias junction voltages, except for junction leakage current. For the device in FIG. 5 a negative gate voltage (lower than $V_S$) creates the channel off condition. Such a negative gate voltage increases the operating voltage of this process, a draw back for JFET scheme.

A PJFET device is analogous to an NJFET device, with the device operational polarity and doping types reversed. PJFET source is held at $V_D$. A PJFET is on when the gate is at $V_D$, and off when the gate is more positive than $V_D$ increasing the voltage level of the process. Conducting path includes P+ doped source and drain regions, and a P− doped channel sandwiched between two N+ doped gate regions. For terminals at voltages $V_S$ and $V_D$, operating range of NJFET gate is less than $V_S$ to $V_S$, while the operating range for PJFET gate is $V_D$ to more than $V_D$. This non-overlapping gate voltage prevents having a common gate input.

Compared to the non-conducting body 400 of MOSFET on FIG. 4, the JFET has a conducting channel 406 between source and drain. Due to non-overlapping gate voltages and the high voltage range thus needed, a complementary JFET process is impractical to realize. Hence there is no low cost process that provides CJFET devices analogous to CMOS devices. Compared to the MOSFET in FIG. 4, a JFET conducting channel is formed inside the body of the switching device. This channel current is not affected by trapped oxide charges near the gate, a draw back with MOSFETs. Compared to MOSFETs, JFETs also have poorer switching characteristics due to higher depleted charge stored in the channel and the transient times required to accumulate and disperse this depletion charge. Reverse biased junctions hurt JFET device ease of use and popularity in modern day ICs.

For the discussion that follows, the terminology Gated-FET device is used. A gated-FET device is defined as a mixed device between a conventional MOSFET device and a conventional JFET device. The Gated-FET device conducting channel is like that of JFET devices: entirely comprising of a thin film resistive channel between the source and drain regions. There is no inversion layer like in a MOSFET to conduct current. The Gated-FET device gate is like that of a MOSFET device: the gate constructed above a dielectric material and capable of modulating the thin film channel conduction. There is no gate junction like in a JFET to reverse bias the channel. The Gated-FET device is disclosed in detail in the application "Insulated-Gate Field-Effect Thin Film Transistors".

SUMMARY

In one aspect, a switching device includes a conducting path of a first device coupled between a first supply voltage and a common output; and a conducting path of a second device coupled between a second supply voltage and said common output; and a common input to control said first and second devices; and said first and second devices comprised of a Gated-FET device. Conducting path of said Gated-FET device is comprised of a source, a resistive channel and a drain region wherein, said resistive channel is formed in between said source and drain regions comprised of same dopant type as said source and drain regions, and said resistive channel is modulated to a substantially non-conductive state by a first voltage level of said common input, and said resistive channel is modulated to a substantially conductive state by a second voltage level of said common input.

In a second aspect, a switching device includes a conducting path of a first device coupled between a first supply voltage and a common output; and a conducting path of a second device coupled between a second supply voltage and said common output; and a common input to control said first and second devices; and said conductive paths of first and said second devices comprised of a single geometry of a semiconductor material.

Advantages of the invention may include one or more of the following. A switching device uses Gated-FET transistors with no increase in voltage range compared to JFET. A switching device has a smaller area by eliminating the latch-up spacing requirement of a twin-well process. The two devices in a switch are constructed in one semiconductor geometry. A switching device is constructed with all semiconductor thin film transistors. The switching device is constructed in a second semiconductor plane, different from a first plane used for logic transistor construction. The switching device is a CMOS inverter. The switching device is a Complementary Gated-FET (CGated-FET) inverter. The CGated-FET inverter is constructed with a common gate with identical voltage range to power and ground voltage levels. The switching device is a mixed MOSFET and Gated-FET inverter. A latch is constructed with two inverters connected back to back. A thin film transistor body is fully depleted. The transistors have fully salicided source and drain regions adjacent to lightly doped source and drain tip regions. The switching devices and latches consume less silicon area. Large latch arrays have a lower cost in spite of the added wafer cost for process complexity.

The method of fabricating the new switch may have one or more of following advantages. The new switch is fabricated as thinned down crystalline Silicon layer in SOI technology, having very high performance. The new switch is fabricated in poly-crystalline silicon layers using thin films and thin film transistors (TFT). A latch may be constructed with a conventional inverter, and a new inverter vertically integrated. A TFT module layer may be inserted to a logic process module. The TFT module layer may be inserted to SOI process module.

Implementation of the new switch may have one or more following advantages. Latches are vertically integrated to a logic process for FPGA applications. A split latch is constructed with a conventional inverter in a first layer, and a new inverter in a second layer connected back to back. A split latch is used to construct high density SRAM memory. A split SRAM memory is used for high memory content FPGA applications. The split level latch cells have very high performance similar to full CMOS latches. The split level latches have very low power consumption similar to full CMOS SRAM memory. New latches can be used for very fast access embedded memory applications. Thinned down split latch SOI memory allows very high memory densities. The latch can be used in embedded memory or high density memory. The complete TFT latch can be stacked above logic transistors, further reducing silicon area and cost. Full TFT latches have longer access times, but useful for slow memory applications. Slow TFT latches can be used in PLDs (Programmable Logic Devices) and subsequently mapped to ASICs (Application Specific Integrated Circuit). The PLDs are used for prototyping and low volume production, while the ASICs are used for high volume production. In PLDs, programmable TFT latches are used. In ASICs the latches are replaced with hard-wired metal.

The invention thus provides an attractive solution for two separate industries: (i) very high density stand alone or embedded low power, fast access SRAM memory and (ii) high-density, low-cost SRAM for PLD and FPGA with convertibility to ASIC.

BRIEF DESCRIPTION OF THE DRAWINGS

FIG. 11 show constructional cross sections of processing steps showing fabrication of one embodiment of the TFT switch.

DESCRIPTION

The terms wafer and substrate used in the following description include any structure having an exposed surface with which to form the switch structure of the invention. The term substrate is understood to include semiconductor wafers. The term substrate is also used to refer to semiconductor structures during processing, and may include other layers that have been fabricated thereupon. The term layer is used for processing steps used in the manufacturing process. The term layer also includes each of the masking layers of the process. Both wafer and substrate include doped and undoped semiconductors, epitaxial semiconductor layers supported by a base semiconductor or insulator, SOI material as well as other semiconductor structures well known to one skilled in the art. The term conductor is understood to include semiconductors, and the term insulator is defined to include any material that is less electrically conductive than the materials referred to as conductors. The term conducting path defines conductors and semiconductors connected in series. A conducting path includes multiple semiconductor regions having different dopant levels. A conducting path may be conductive or non-conductive based on the semiconductor properties in the conducting path. The term geometry is used to define an isolated pattern of a masking layer. Thus one mask layer is a collection of geometries in the mask pattern. The term module includes a structure that is fabricated using a series of predetermined process steps. The boundary of the structure is defined by a first step, one or more intermediate steps, and a final step. The resulting structure is formed on a substrate. The following detailed description is, therefore, not to be taken in a limiting sense.

Figure 1:
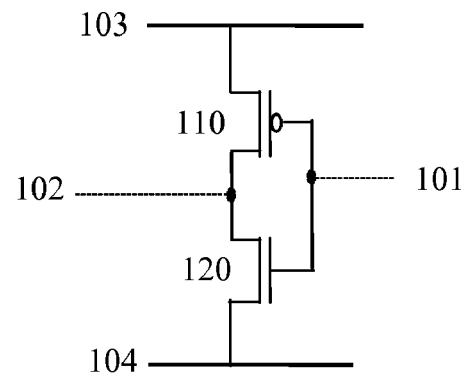
FIG. 1 shows a conventional CMOS inverter (switch).
Figure 2A:
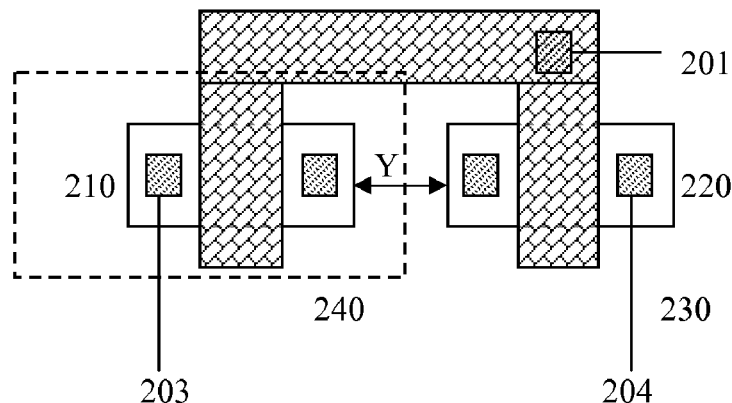
FIGS. 2A and 2B show conventional CMOS inverter fabricated using a conventional twin well process.
Figure 2B:
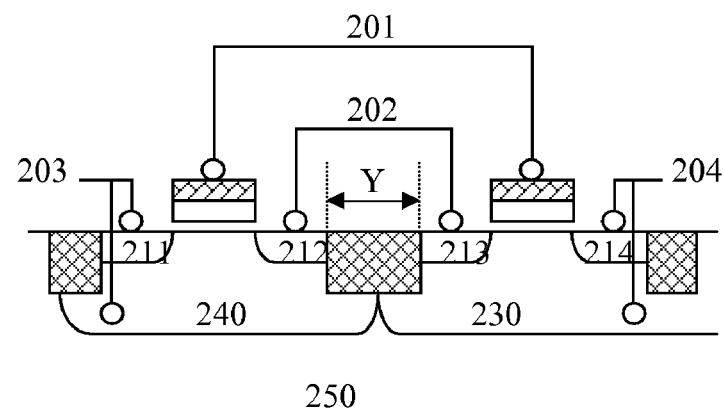
Figure 3A:
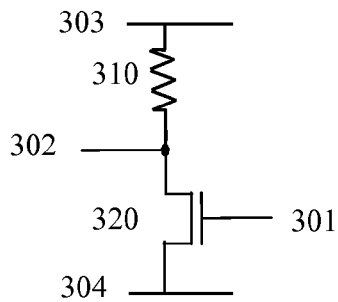
FIGS. 3A and 3B shows a conventional resistor load inverter and a conventional TFT PMOS load inverter.
Figure 3B:
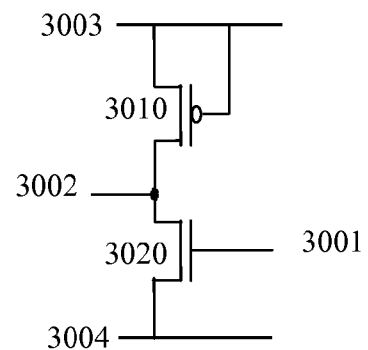
Figure 6A:
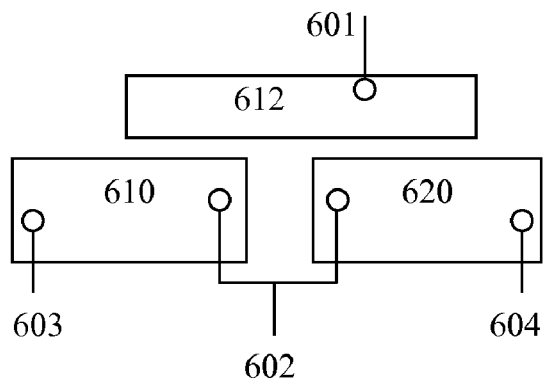
FIGS. 6A and 6B show embodiments of switching devices.
Figure 6B:
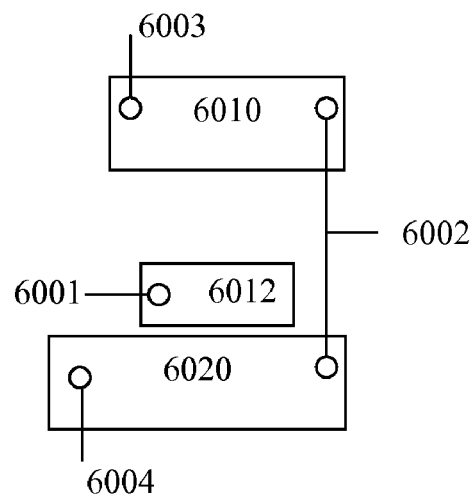

The switches shown in FIGS. 1, 2, and 3 are schematically shown in FIG. 6. The switch shown in FIG. 6A has not been constructed with JFET devices due to voltage limitations. In the conventional CMOS switching device shown in FIG. 1 and FIG. 6A, the conducting path 610 allows current flow between terminal 603 and output 602, while conducting path 620 allows current flow between terminal 604 and output 602. The conducting paths 610 and 620 are constructed in single crystal semiconductor active geometries. These active geometries are physically separated to allow for the latch up related well rules discussed earlier. First device comprises gate 612 and conducting path 610. Second device comprises gate 612 and conducting path 620. Conducting path 610 couples output 602 to first voltage source 603. Conducting path 620 couples output 602 to second voltage source 604. Voltage level at common gated input 601 selects which of the two voltage sources 603 or 604 is coupled to output 602. In the conventional resistor load switching device shown in FIG. 3A and FIG. 6B, the conducting path for current flow is via the resistor and the single crystal active regions. The conducting path 6010 is the resistor or the TFT resistor itself. Second device comprises gate 6012 and conducting path 6020. Conducting paths 6010 and 6020 are physically separated to facilitate the vertical integration. Conducting path 6010 permanently couples a first voltage source 6003 to output 6002, while conducting path 6020 couples output 6002 to second voltage source 6004. Voltage level at common input 6001 couples the output 6002 to one of two voltage sources 6003 or 6004. In both cases the two conducting paths are constructed in two separate semiconductor geometries and connected together at the common node by either metal contacts, or buried contacts.

In a first embodiment of the new switching device the transistors are constructed as Gated-FET devices. The switching device in FIG. 6A comprises a conducting path 610 of a first device coupled between a first supply voltage 603 and a common output 602; and a conducting path 620 of a second device coupled between a second supply voltage 603 and said common output 602; and a common input 601 to control said first and second devices. Conducting paths 610 and 620 of Gated-FET devices comprises a source, a resistive channel and a drain region wherein, said resistive channel is formed in between said source and drain regions comprised of same dopant type as said source and drain regions, and said resistive channel is modulated to a substantially non-conductive state by a first voltage level of said common input 601, and said resistive channel is modulated to a substantially conductive state by a second voltage level of said common input 601.

The switching device in FIG. 6A further comprises a common input 601 voltage at a first level turning said conducting path 610 of first device off and said conducting path 620 of second device on to couple said second supply voltage 604 to said common output 602; and said common input 601 voltage at a second level turning said conducting path 610 of first device on and said conducting path 620 of second device off to couple said first supply voltage 603 to said common output 602.

Figure 7:
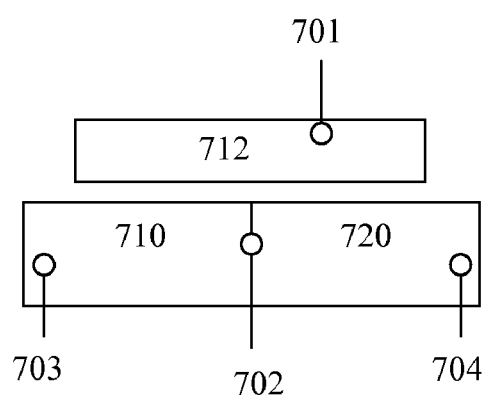
FIG. 7 shows a smaller area embodiment of a switching device.

In a second embodiment of the new switching device, the conducting paths of first and second devices are constructed in one plane of single semiconductor geometry. The new switching device in FIG. 7A comprises a conducting path 710 of a first device coupled between a first supply voltage 703 and a common output 702; and a conducting path 720 of a second device coupled between a second supply voltage 704 and said common output 702; and a common input 701 to control said first and second devices; and said conductive paths 710 and 720 of first and said second devices comprised of a single geometry of a semiconductor material. The device in FIG. 7 is further comprised of said conducting path modulated to a non-conductive state by a first voltage level of said common input 701; and said conducting path modulated to a conductive state by a second voltage level of said common input 701.

Figure 8A:
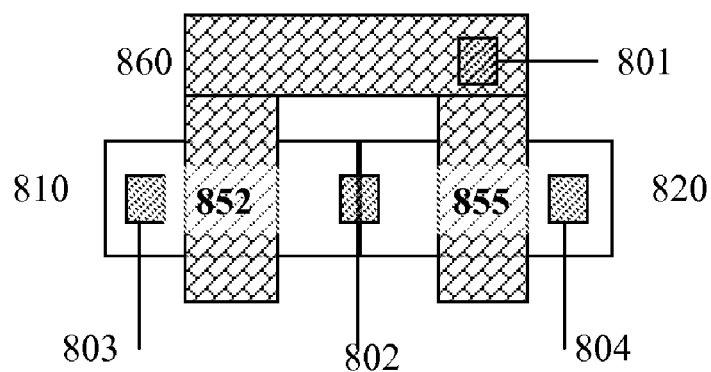
FIGS. 8A, 8B and 8C show CMOS inverter fabricated using a thin film process.
Figure 8B:
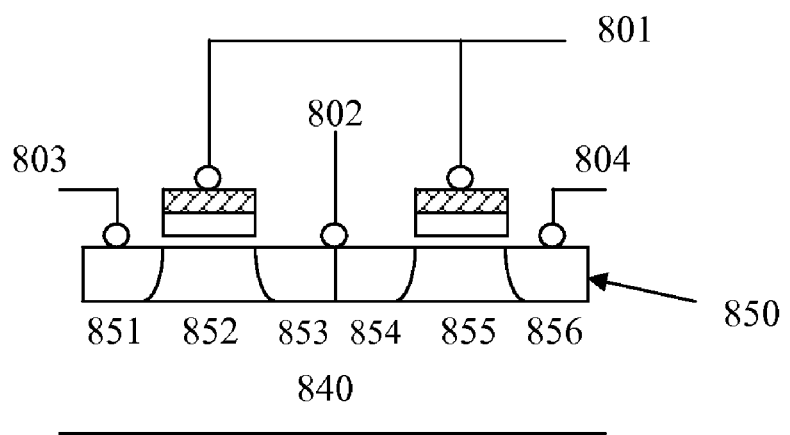
Figure 8C:
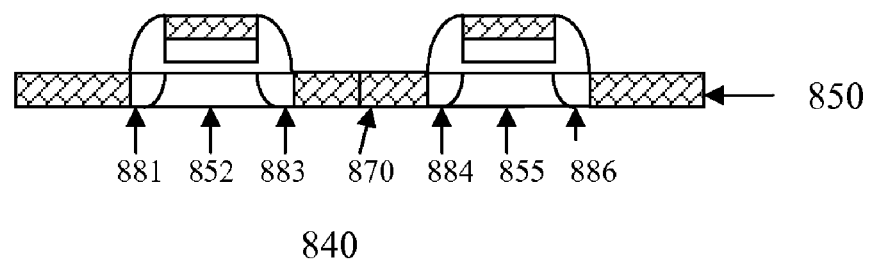

In one embodiment of a new switch, all of the transistors are constructed using thin film MOSFET transistors. FIGS. 8A, 8B and 8C show the top view and cross sectional view of a thin film CMOS MOSFET inverter in accordance with aspects of the present invention. Comparing FIG. 2A with 8A, the spacing Y=0 for TFT CMOS inverter. There is also no N-well and no P-well. TFT PMOS 810 is butted against TFT NMOS 820 at the common output node 802. Common gate node 860 having a common input terminal 801 ties the PMOS gate region 852 to NMOS gate region 855. Both devices are built on single semiconductor geometry 850 as shown in FIG. 8B, but have multiple implant regions: PMOS source 851, PMOS body 852, PMOS drain 853, NMOS drain 854, NMOS body 855, and NMOS source 856. The NMOS gate above 855 is doped N+ while the PMOS gate above 852 is doped P+ to achieve the threshold voltages ($V_T$) for the MOSFETs. For each device, Gate, Drain and Source dopant type is the same. One N+ implant for NMOS and one P+ implant for PMOS can dope Gate, Drain and Source regions after the gates are etched and spacers are formed. The body doping levels P– for NMOS 855 and N– for PMOS 852 are chosen to achieve the desirable $V_T$. FIGS. 8B and 8C are two different embodiments of the present invention. In FIGS. 8B & 8C gates 860 are salicided. In FIG. 8B drain & source regions are either partially salicided or not salicided. N+ and P+ dopant is needed to define drain and source regions. In FIG. 8C, source and drain regions are completely salicided as region 870 to reduce the source & drain resistance. When fully salicided, the source & drain regions are defined by the self aligned tip implants 881, 883, 884 and 886 shown under the spacer oxides adjacent to the gate regions in FIG. 8C, and no N+ or P+ implants are needed. The body regions 852 and 855 are unchanged between FIGS. 8B and 8C.

The first semiconductor geometry 850 forming the conducting paths for devices 810 and 820 can be a thinned down SOI single crystal Silicon film, or a deposited thin Polycrystalline silicon film, or a post laser annealed as deposited amorphous Poly-crystalline silicon film. The thickness of the first layer and doping are optimized with the gate oxide thickness to get the required $V_T$, on-current and off-current for these devices. The first layer thickness is further optimized to contain the conducting full inversion layer within the film thickness and to ensure a fully depleted body for the MOSFET when the device is on. A thickness parameter X for a semiconductor material is defined by:

$$X = q^2/(2 \ast kT \ast \in_S) \text{Angstroms} \qquad (EQ\ 1)$$

Where, q is electron charge, kT/q is the thermal voltage and $\in_S$ is the permittivity of the semiconductor material that is used for the conducting body of the MOSFET. For Si semiconductor at 300 Kelvin, X=299 Angstroms. In this embodiment, the first layer thickness $t_{P1}$ in Angstroms and first layer doping D in Atoms/Angstroms$^3$ are chosen such that it satisfies the following inequalities:

$$1/(D \ast t_{P1}^2) < X \text{Angstroms} \qquad (EQ\ 2)$$

$$1/(D \ast t_{P1}^2) > 0.5 \ast X/Ln(D/N_i) \text{Angstroms} \qquad (EQ\ 3)$$

Where, $N_i$ is the intrinsic carrier concentration of the semiconductor material. For Silicon at room temperature, $N_i$=1.45e-14 Atoms/A$^3$. For 250 A thick first silicon film doped to 5E-7 Atoms/A$^3$, the left hand ratio of Eq-2 and Eq-3 becomes 32 A, while X is 299 A (rounded to 300 A for simplicity) and the right hand side of Eq-3 is 8.6 Angstroms. Both of the inequalities are thus satisfied. For a practical range of gate oxide thicknesses in the range 30A to 100A, the body region needs to be doped >1E16 Atoms/cm$^3$ to achieve the correct threshold voltage. For that minimum doping density, the right hand side of Eq-3 becomes 11 Angstroms. The first inequality in Eq-2 ensures that when the MOSFET is on, the inversion layer is fully contained inside the first layer. The second condition in Eq-3 ensures that the first layer is fully depleted when the MOSFET is on. The first thin layer and second gate layer salicidation is achieved in one salicidation process step. The deposited Nickel or Cobalt thickness and Rapid Thermal Anneal cycle optimization will allow full consumption of first layer during salicidation. The functionality of the new inverter is identical to the conventional inverter shown in FIG. 2, but occupies much less area.

Other embodiments may use gate and substrate materials different from silicon. Gate dielectrics can be oxide, oxynitride, nitride, or multi-layered insulators. The semiconductor material may be silicon, silicon-germanium, gallium-arsenide, germanium, or any other III-V material. The gate material may be poly-silicon, aluminum, tungsten, or any other metal. The value of X in equation-1 will change based on the physical properties of the materials chosen to form the MOSFET device. The device threshold voltage is designed to be in the range ⅕ to ⅓ of Vcc value and the gate oxide thickness is optimized and surface charge density is controlled to achieve that.

Figure 4:
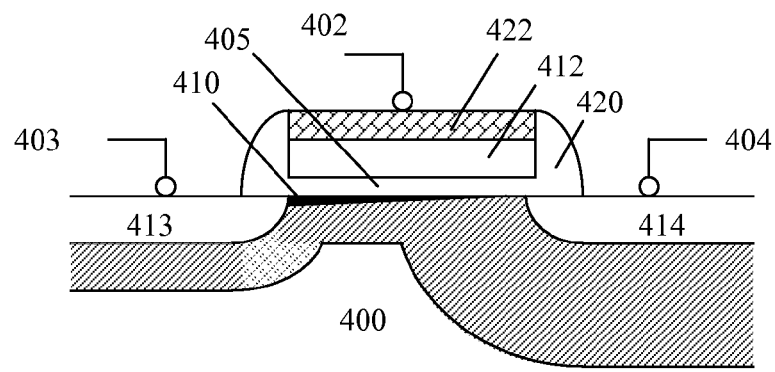
FIG. 4 shows a conventional NMOS transistor conduction channel.
Figure 5:
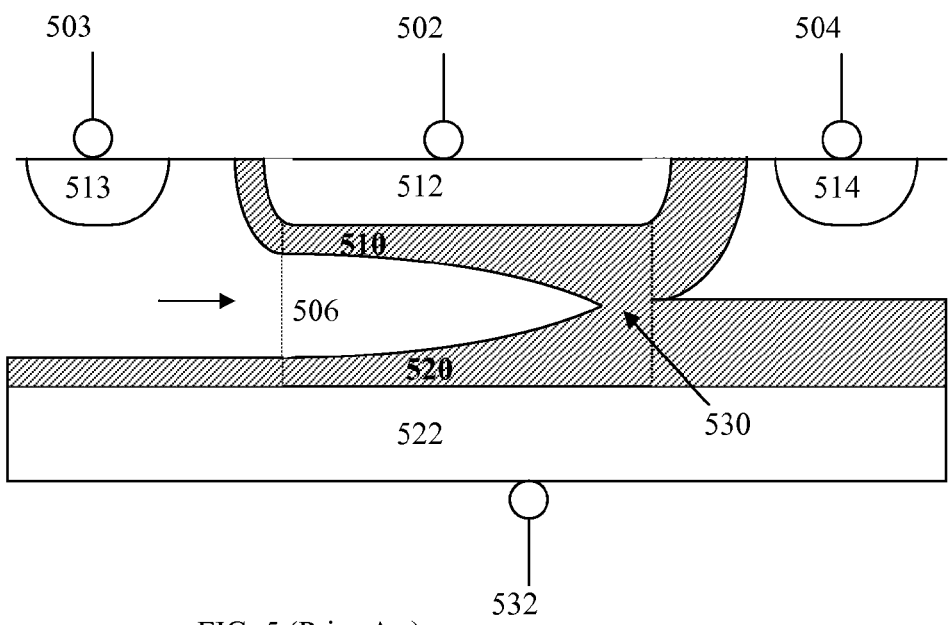
FIG. 5 shows a conventional NJFET transistor conduction channel.
Figure 9A:
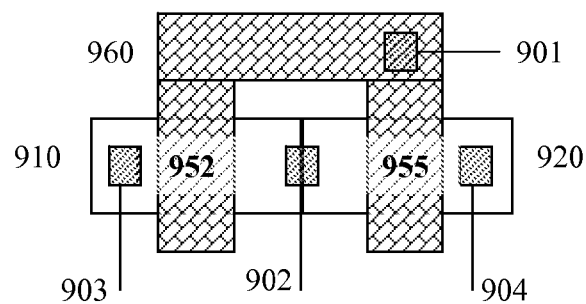
FIGS. 9A and 9B show a Complementary Gated-FET inverter fabricated using a thin film process.
Figure 9B:
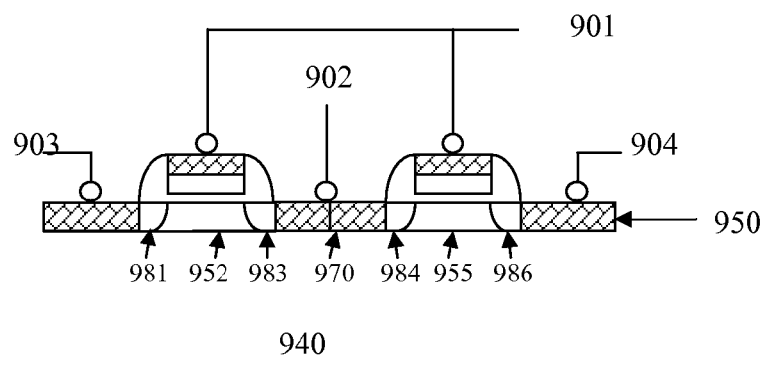

In another embodiment of the inverter, all of the thin film transistors are constructed using complementary Gated-FETs, while maintaining the logic voltage level of the process. FIGS. 9A and 9B show the top view and cross sectional view of a TFT Gated-FET inverter in accordance with aspects of the present invention. Compared to the JFET device in FIG. 5, the Gated-JFET device in FIG. 10 has an identical conducting body, but the double diffused gate is replaced by a single insulated-Gate like that in MOSFET FIG. 4.

In FIG. 9, a Gated-PFET device 910 and a Gated-NFET device 920 (as detailed in FIGS. 9A & 9B) are merged at a common node 902. The Gated-PFET source is connected to a first voltage source 103 ($V_D$) and Gated-NFET source is connected to a second voltage source 104 ($V_S$). These could be power and ground terminals respectively. There is also no N-well and no P-well. Common gate node 960 having a common input Vin 901 ties the Gated-PFET gate region 952 to Gated-NFET gate region 955. During operation, if the gate is zero, the Gated-PFET device 910 is on, and the Gated-NFET device 920 is off, and the common node 902 is coupled to $V_D$ so that the output is at logic one. If the gate is at logic one, the Gated-PFET device 910 is off and the Gated-NFET device 920 is on, and the common node 902 is coupled to $V_S$ to provide a logic zero at the output. Compared to conventional JFET shown in FIG. 5, the thin film Gated-FET can be built with a common gate by appropriate control of layer 950 thickness. One aspect of this invention is the ability to have a complementary gate input for Gated-FET inverter with identical voltage range.

Both devices are built on a single semiconductor geometry 950 as shown in FIG. 9B, but have multiple implant regions: Gated-PFET source 981, Gated-PFET body 952, Gated-PFET drain 983, Gated-NFET drain 984, Gated-NFET body 955, and Gated-NFET source 986. A second aspect of this invention is the ability to have a single geometry for both conducting paths. The Gated-NFET gate above 955 is doped P+ while the Gated-PFET gate above 952 is doped N+ to achieve the threshold voltages ($V_T$) for the Gated-FETs. The channel doping levels N− for Gated-NFET 955 and P− for Gated-PFET 952 are chosen to achieve the desirable conduction on and off current levels. In FIG. 9B gate 960 is partially salicided while source and drain regions are completely salicided like region 970 to reduce the source & drain resistance. When fully salicided, the source & drain regions are defined by the self aligned tip implants 981, 983, 984 and 986 shown under the spacer oxides adjacent to the gate regions in FIG. 9C, and no N+ or P+ implants are needed.

Compared to FIG. 8, the Gated-FET gates in FIG. 9 are doped opposite to Source/Drain dopant type. This is easily achieved in the fully salicided source/drain embodiment shown in FIG. 9B. The Gated-NFET and Gated-PFET gate regions are first doped P+ and N+ respectively before the gates are etched. After gates are etched, prior to spacer formation, Gated-NFETs are implanted with N tip implant and Gated-PFETs are implanted with P tip implant. The tip-implant dose is much lower than the gate doping to affect gate doping type. The Source & Drain regions are now defined by the self aligned tip implants shown under the spacer oxides adjacent to the gate regions. As the drain and source regions outside the spacer are fully consumed by salicide, those regions do not need heavy doping. The channel doping levels N− for Gated-NFET and P− for Gated-PFET are chosen to achieve the desirable $V_T$. The Gated-NFET is off with zero bias on the gate by fully depleting the first thin film region under the gate, and is on when the gate is at $V_D$. The Gated-PFET is off with $V_D$ bias on the gate by fully depleting the first thin film region under the gate, and is on when the gate is at $V_S$. The first semiconductor layer forming the body for 910 and 920 can be thinned down SOI single crystal Silicon material, or a first thin-film Polysilicon layer. A thicker first film allows higher current. The thickness is further optimized to allow the entire film to conduct in its on state, and the entire film to be depleted in its off state. A thickness parameter Y for a semiconductor material is defined by:

$$Y=q/(2*\in_S*\Phi_{MS}) \text{Angstroms} \quad (EQ\ 4)$$

Where, q is electron charge and $\in_S$ is the permittivity of the semiconductor material that is used for the conducting body of the Gated-FET and $\Phi_{MS}$ is the gate to body work function. When there is fixed charge in the oxide, $\Phi_{MS}$ in EQ-4 is replaced by $V_{FB}$, the flat band voltage for the device. For $\Phi_{MS}$~1 Volt, and Si semiconductor material, Y is 7.7 Angstroms. In this embodiment, the first layer thickness $t_{P1}$ is in Angstroms, first layer doping D in Atoms/Angstroms$^3$, gate dielectric thickness $t_G$ in Angstroms and permittivity $\in_G$ are chosen such that they satisfy the following inequality:

$$1/[D*(t_{P1}+(\in_S/\in_G)*t_{P1})^2] > Y \text{ Angstroms} \quad (EQ\ 5)$$

For Si-oxide systems with $\Phi_{MS}$~1 Volt, Eq-5 reduces to:

$$1/[D*(t_{P1}+3*t_{OX})^2] > 7.7 \text{ Angstroms} \quad (EQ\ 6)$$

Eq-5 and Eq-6 ensures that the first layer is fully depleted when the Gated-FET is off. For 70 A thick gate oxide, P+ doped poly-silicon top gate at zero potential, Gated-NFET body N− doped to 5E17 Atoms/cm$^3$, the left hand side of Eq-6 allows a maximum first film thickness of 300 A. A more rigorous surface potential and depletion thickness calculation yields a surface potential of 0.454 volts, and a maximum depletion of 343 Angstroms, in good agreement with this result.

Figure 10A:
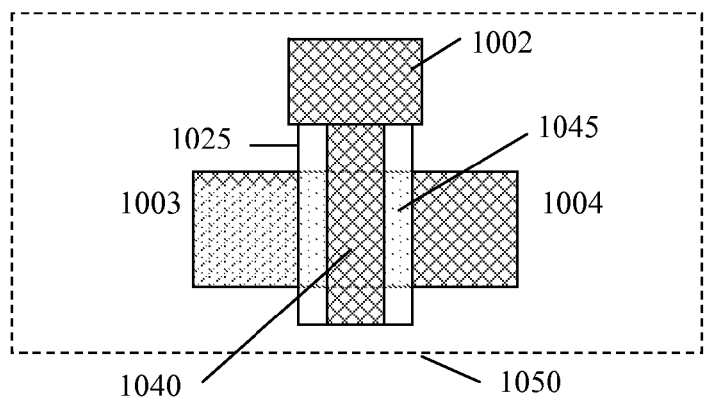
FIGS. 10A and 10B show a top view and a cross-sectional view of a Gated-PFET transistor.
Figure 10B:
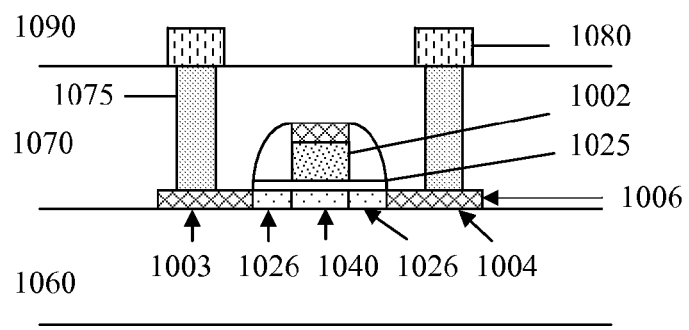

FIGS. 10A and 10B shows a top view and cross section of a Gated-PFET built in two thin film layers separated by a gate dielectric 1025, grown either thermally or deposited by PECVD. The first thin film layer 1006 (P1) forms the body of the transistor. In one embodiment, this is thinned down single crystal SOI layer. In another embodiment this is a deposited polysilicon layer. The P1 layer is deposited above the insulator layer 1060. A P1 mask is used to define and etch these P1 islands. Gated-PFET regions are mask selected and implanted with P– doping, the channel doping level required for Gated-PFET devices. Gated-NFET gets an N– implant. The gate 1002 is deposited after the gate insulator 1025 is deposited as a second thin film layer (P2). In the embodiment shown, the second thin film layer is a polysilicon layer. The Gated-PFET gate poly 1002 is mask selected and implanted N+ prior to gate definition and etch. Gated-NFET gate region is doped P+. The gate regions are then defined and etched. A P tip implant region 1050 is defined and implanted for Gated-PFET, while an N tip is defined and implanted for Gated-NJFET. This can be done by open selecting Gated-PFET devices, and not selecting Gated-NFET device. The N+ doped gates are not affected by the lower P implant level. Gate 1002 blocks P tip implant getting into channel region 1040, and only P1 regions outside P2 gets this P implant. Spacer oxide regions 1025 are formed on either side of gate by conventional oxide deposition and etch back techniques. In FIG. 10A, the P2 gate 1002 is perpendicular to P1 body 1006. The P2 gate and spacers 1025 sub-divide the P1 body into five regions: (1) source region 1003, (2) source spacer region 1026 doped with P tip implant, (3) channel region 1040 doped with P-implant, (4) drain spacer region 1026 also doped with P tip implant and (5) drain region 1004. The source and drain regions are fully salicided and need no implant. After the spacer etch, exposed P2 and P1 regions are reacted with deposited Nickel (or Cobalt) and salicided using Rapid Thermal Annealing. The P tip implant after P2 etch forms self-aligned P Source/Drain tip regions and salicidation after spacer etch forms self aligned Source/Drain salicide regions.

The total resistance of the conducting body region for Gated-PFET and Gated-NFET is determined as follows:

$$R = \rho_{P1} * L_{P2}/(W_{P1} * t_{P1}) \quad (EQ\ 7)$$

where, $\rho_{P1}$ is the resistivity of lightly doped P1 region in the resistive channel, $L_{P2}$ is poly resistor length 1040 in FIG. 10B, $W_{P1}$ is the width of P1 1040 in FIG. 10A, and $t_{P1}$ is P1 thickness (FIG. 9B). Gate voltage and channel depletion heavily modulates resistivity $\rho_{P1}$. Parameters are chosen for R to be in the 1 KOhm to 1 Meg-Ohm range, preferably 10 KOhm to 100 KOhms, when the channel is on and Vds=Vcc. As an example, for P– doping 2E17 atoms/cm$^3$, neglecting the effect of channel modulation in the P– region, the resistivity for single crystal Silicon is 0.12 Ohm-cm. When $L_{P2}$=0.3μ, $W_{P1}$=0.3μ, $t_{P1}$=400 Angstroms, R is 30 KOhms. This is the conducting path resistance under flat band conditions. When $V_{DS}$=0.3V, the channel current $I_{ON}$ is 10 μA. Poly-silicon mobility is lower than single crystal silicon degrading the on current, while surface accumulation from the gate bias can enhance the on current. Gated-FETs allow thicker P1 film thicknesses compared to MOSFETs in thin film devices, and hence higher currents.

The usage of thin films eliminates the need for diode gates and associated forward biased diode currents in Gated-FETs. Thus, the voltage level is not increased. It also allows forming Gated-NFET and Gated-PFET in the same process, and combining those to form logic inverters with a common thin film node. Moreover, the P1 film isolates N– body and P– body from one another, minimizing latch-up possibilities allowing a smaller inverter layout area. Other embodiments may use gate and substrate materials different from silicon. Gate dielectrics can be oxide, oxy-nitride, nitride, or multi-layered insulators. The semiconductor material may be silicon, germanium-silicon, gallium-arsenide, or germanium. The gate material may be poly-silicon, aluminum, tungsten, or any other metal. The device threshold voltage is designed to be in the range ⅕ to ⅓ of Vcc value.

In other embodiments in accordance with the current invention, the inverter can be made by combining MOSFET and Gated-FET devices. In one embodiment, a PMOS pull up device-1 and Gated-NFET pull down device-2 can form the inverter. In another embodiment, a Gated-PFET pull up device-1 and an NMOS pull down device 2 can form the inverter. The pull-up device source is connected to $V_D$ and pull-down device source is connected to $V_S$ for both inverters. These mixed mode inverter pairs allow first thin-film body to be doped with the same dopant type, facilitating device optimization with a no mask, blanket, first thin film implant. The tip implant type and gate implant type differentiate between the two device types.

For the devices 710 and 720 in FIG. 7 a high quality P1 film is beneficial. As used herein, P1 refers to the first semiconductor layer in FIG. 7 and P2 refers to the second semiconductor layer in FIG. 7 forming the gate. An ideal film is a single crystal silicon with a precise thickness control over an insulator. In SOI technology, the single crystal silicon layer above an insulator meets this criterion. Inside the latch array, P1 is mask selected and thinned down to the required thickness as defined by Eq-2, 3 or Eq-5.

The following terms used herein are acronyms associated with certain manufacturing processes. The acronyms and their abbreviations are as follows:

$V_T$ Threshold voltage
LDN Lightly doped NMOS drain
LDP Lightly doped PMOS drain
LDD Lightly doped drain
RTA Rapid thermal annealing
Ni Nickel
Ti Titanium
TiN Titanium-Nitride
W Tungsten
S Source
D Drain
G Gate
ILD Inter layer dielectric
C1 Contact-1
M1 Metal-1
P1 Poly-1
P– Positive light dopant (Boron species, BF$_2$)
N– Negative light dopant (Phosphorous, Arsenic)
P+ Positive high dopant (Boron species, BF$_2$)
N+ Negative high dopant (Phosphorous, Arsenic)
Gox Gate oxide
C1 Contact-2
LPCVD Low pressure chemical vapor deposition
CVD Chemical vapor deposition
ONO Oxide-nitride-oxide
LTO Low temperature oxide A logic process is used to fabricate CMOS devices on a substrate layer. These CMOS devices may be used to build AND gates, OR gates, inverters, adders, multipliers, memory and other logic functions in an integrated circuit. A CMOS-FET TFT module layer or a CGated-FET TFT module layer may be inserted to a logic process at a first contact mask to build a second set of TFT MOSFET or Gated-FET devices. An exemplary logic process may include one or more following steps:

P-type substrate starting wafer
Shallow Trench isolation: Trench Etch, Trench Fill and CMP
Sacrificial oxide
PMOS $V_T$ mask & implant
NMOS $V_T$ mask & implant
Pwell implant mask and implant through field Nwell implant mask and implant through field
Dopant activation and anneal
Sacrificial oxide etch
Gate oxidation/Dual gate oxide option
Gate poly (GP) deposition
GP mask & etch
LDN mask & implant
LDP mask & implant
Spacer oxide deposition & spacer etch
N+ mask and NMOS N+ G, S, D implant
P+ mask and PMOS P+ G, S, D implant
Ni deposition
RTA anneal—Ni salicidation (S/D/G regions & interconnect)
Unreacted Ni etch
ILD oxide deposition & CMP FIG. 11 shows an exemplary process for fabricating a thin film MOSFET latch in a module layer. In one embodiment the process in FIG. 11 forms the latch in a layer substantially above the substrate layer. The processing sequence in FIGS. 11.1 through 11.7 describes the physical construction of a MOSFET device shown in FIG. 7, and FIG. 9. The process of FIG. 11 includes adding one or more following steps to the logic process after ILD oxide CMP step.

C1 mask & etch
W-Silicide plug fill & CMP
~300 A poly P1 (crystalline poly-1) deposition
P1 mask & etch
Blanket Vtn P– implant (NMOS Vt)
Vtp mask & N– implant (PMOS Vt)
TFT Gox (70 A PECVD) deposition
500 A P2 (crystalline poly-2) deposition
P2 mask & etch
Blanket LDN NMOS N– tip implant
LDP mask and PMOS P– tip implant
Spacer LTO deposition
Spacer LTO etch to form spacers & expose P1
Blanket N+ implant (NMOS G/S/D & interconnect)
P+ mask & implant (PMOS G/S/D & interconnect)
Ni deposition
RTA salicidation and poly re-crystallization (G/S/D regions & interconnect)
Dopant activation anneal
Excess Ni etch
ILD oxide deposition & CMP
C2 mask & etch
W plug formation & CMP
M1 deposition and back end metallization The TFT process technology consists of creating NMOS & PMOS poly-silicon transistors. In the embodiment in FIG. 11, the module insertion is after the substrate device gate poly etch and the ILD film is deposition. In other embodiments the insertion point may be after M1 and the ILD is deposition, prior to V1 mask, or between two metal definition steps.

After gate poly of regular transistors are patterned and etched, the poly is salicided using Nickel & RTA sequences. Then the ILD is deposited, and polished by CMP techniques to a desired thickness. In the shown embodiment, the contact mask is split into two levels. The first C1 mask contains all contacts that connect latch outputs to substrate transistor gates and active nodes. Then the C1 mask is used to open and etch contacts in the ILD film. Ti/TiN glue layer followed by W-Six plugs, W plugs or Si plugs may be used to fill the plugs, then CMP polished to leave the fill material only in the contact holes. The choice of fill material is based on the thermal requirements of the TFT module.

Then, a first P1 poly layer, amorphous or crystalline, is deposited by LPCVD to a desired thickness as shown in FIG. 11.1. The P1 thickness is between 50 A and 1000 A, and preferably 250 A. This poly layer P1 is used for the channel, source, and drain regions for both NMOS and PMOS TFT's. It is patterned and etched to form the transistor body regions. In other embodiments, P1 is used for contact pedestals. NMOS transistors are blanket implanted with P– doping, while the PMOS transistor regions are mask selected and implanted with N– doping. This is shown in FIG. 11.2. The implant doses and P1 thickness are optimized to get the required threshold voltages for PMOS & NMOS devices under fully depleted transistor operation, and maximize on/off device current ratio. The pedestals implant type is irrelevant at this point. In another embodiment, the $V_T$ implantation is done with a mask P– implant followed by masked N– implant. First doping can also be done in-situ during poly deposition or by blanket implant after poly is deposited.

Patterned and implanted P1 may be subjected to dopant activation and crystallization. In one embodiment, RTA cycle is used to activate & crystallize the poly after it is patterned to near single crystal form. In a second embodiment, the gate dielectric is deposited, and buried contact mask is used to etch areas where P1 contacts P2 layer. Then, Ni is deposited and salicided with RTA cycle. All of the P1 in contact with Ni is salicided, while the rest poly is crystallized to near single crystal form. Then the unreacted Ni is etched away. In a third embodiment, amorphous poly is crystallized prior to P1 patterning with an oxide cap, metal seed mask, Ni deposition and MILC (Metal-Induced-Lateral-Crystallization).

Then the TFT gate dielectric layer is deposited followed by P2 layer deposition. The dielectric is deposited by PECVD techniques to a desired thickness in the 30-200 A range, desirably 70 A thick. The gate may be grown thermally by using RTA. This gate material could be an oxide, nitride, oxynitride, ONO structure, or any other dielectric material combination used as gate dielectric. The dielectric thickness is determined by the voltage level of the process. At this point an optional buried contact mask (BC) may be used to open selected P1 contact regions, etch the dielectric and expose P1 layer. BC could be used on P1 pedestals to form P1/P2 stacks over C1. In the P1 salicided embodiment using Ni, the dielectric deposition and buried contact etch occur before the crystallization. In the preferred embodiment, no BC is used.

Then second poly P2 layer, 300 A to 2000 A thick, preferably 500 A is deposited as amorphous or crystalline polysilicon by LPCVD as shown in FIG. 11.3. P2 layer is defined into NMOS & PMOS gate regions intersecting the P1 layer body regions, C1 pedestals if needed, and local interconnect lines and then etched. The P2 layer etching is continued until the dielectric oxide is exposed over P1 areas uncovered by P2 (source, drain, P1 resistors). As shown in FIG. 10A, the source & drain P1 regions orthogonal to P2 gate regions are now self aligned to P2 gate edges. The S/D P2 regions may contact P1 via buried contacts. NMOS devices are blanket implanted with LDN N– dopant. Then PMOS devices are mask selected and implanted with LDP P– dopant as shown in FIG. 11.4. The implant energy ensures full dopant penetration through the residual oxide into the S/D regions adjacent to P2 layers.

A spacer oxide is deposited over the LDD implanted P2 using LTO or PECVD techniques. The oxide is etched to form spacers 1025 shown in FIG. 10A. The spacer etch leaves a residual oxide over P1 in a first embodiment, and completely removes oxide over exposed P1 in a second embodiment. The latter allows for P1 salicidation at a subsequent step. Then NMOS devices & N+ poly interconnects are blanket implanted with N+. The implant energy ensures full or partial dopant penetration into the 100 A residual oxide in the S/D regions adjacent to P2 layers. This doping gets to gate, drain & source of all NMOS devices and N+ interconnects. The P+ mask is used to select PMOS devices and P+ interconnect, and implanted with P+ dopant as shown in FIG. 11.5. PMOS gate, drain & source regions receive the P+ dopant. This N+/P+ implants can be done with N+ mask followed by P+ mask. The $V_T$ implanted P1 regions are now completely covered by P2 layer and spacer regions, and form channel regions of NMOS & PMOS transistors.

After the P+/N+ implants, Nickel is deposited over P2 and salicided to form a low resistive refractory metal on exposed poly by RTA. Un-reacted Ni is etched as shown in FIG. 11.6. This 100 A-500 A thick Co-salicide connects the opposite doped poly-2 regions together providing low resistive poly wires for data. In one embodiment, the residual gate dielectric left after the spacer prevents P1 layer salicidation. In a second embodiment, as the residual oxide is removed over exposed P1 after spacer etch, P1 is salicided. The thickness of Ni deposition may be used to control full or partial salicidation of P1 regions in FIG. 10 and FIG. 11.6. Fully salicided S/D regions up to spacer edge facilitate high drive current due to lower source and drain resistances.

An LTO film is deposited over P2 layer, and polished flat with CMP. A second contact mask C2 is used to open contacts into the TFT P2 and P1 regions in addition to all other contacts to substrate transistors. In the shown embodiment, C1 contacts connecting latch outputs to substrate transistor gates require no C2 contacts. Contact plugs are filled with tungsten, CMP polished, and connected by metal as done in standard contact metallization of IC's as shown in FIG. 11.7.

A TFT process sequence similar to that shown in FIG. 11 can be used to build complementary Gated-FET thin film devices shown in FIGS. 9 and 10. The process steps facilitate the device doping differences between MOSFET and Gated-FET devices, and simultaneous formation of complementary Gated-FET TFT devices. A detailed description for this process was provided when describing FIG. 10 earlier. An exemplary CGated-FET process sequence may use one or more of the following steps:

C1 mask & etch
W-Silicide plug fill & CMP
~300 A poly P1 (crystalline poly-1) deposition
P1 mask & etch
Blanket Vtn N− implant (Gated-NFET $V_T$)
Vtp mask & P− implant (Gated-PFET $V_T$)
TFT Gox (70 A PECVD) deposition
500 A P2 (crystalline poly-2) deposition
Blanket P+ implant (Gated-NFET gate & interconnect)
N+ mask & implant (Gated-PFET gate & interconnect)
P2 mask & etch
Blanket LDN Gated-NFET N tip implant
LDP mask and Gated-PFET P tip implant
Spacer LTO deposition
Spacer LTO etch to form spacers & expose P1
Ni deposition
RTA salicidation and poly re-crystallization (exposed P1 and P2)
Fully salicidation of exposed P1 S/D regions
Dopant activation anneal
Excess Ni etch
ILD oxide deposition & CMP
C2 mask & etch
W plug formation & CMP
M1 deposition and back end metallization In another embodiment, thinned down SOI is used to construct the latch shown in FIG. 7. A logic process used to fabricate CMOS devices on a substrate layer is modified to accommodate thinned down latch regions. These periphery devices may be used to build AND gates, OR gates, inverters, adders, multipliers, memory and other logic functions in an integrated circuit. Latch devices may be constructed to integrate a high density of latches or memory into the first fabrication module. A thinned down module is inserted to an exemplary logic process that may include one or more of following steps:

SOI substrate wafer
Shallow Trench isolation: Trench Etch, Trench Fill and CMP
Sacrificial oxide
Periphery PMOS $V_T$ mask & implant
Periphery NMOS $V_T$ mask & implant
Periphery Pwell implant mask and implant through field
Periphery Nwell implant mask and implant through field
Latch mask and silicon etch
Latch NMOS $V_T$ mask and implant
Latch PMOS $V_T$ mask and implant
Dopant activation and anneal
Sacrificial oxide etch
Gate oxidation/Dual gate oxide option
Gate poly (GP) deposition
GP mask & etch
LDN mask & N− implant
LDP mask & P− implant
Spacer oxide deposition & spacer etch
N+ mask and N+ implant
P+ mask and P+ implant
Ni deposition
RTA anneal-Ni salicidation (S/D/G regions & interconnect)
Dopant activation
Unreacted Ni etch
ILD oxide deposition & CMP
C mask and etch In this embodiment, the latch body doping is independently optimized for performance, but shares the same LDN, LDP, N+ and P+ implants. The SOI thickness is assumed to be large to warrant well implants for peripheral CMOS devices. Based on dopant type selection, the latch can be complementary MOSFET or Gated-FET devices. In the Gated-FET embodiment, the Gated-FET gates are separately doped N+ & P+ prior to gate etch, and blocked during N+/P+ implants of peripheral devices. In other embodiments, latch devices and periphery devices may share one or more $V_T$ implants. One P2 is used for latch and peripheral device gates. In another embodiment, SOI substrate devices may be integrated with a TFT latch module. This allows for a SOI inverter and TFT inverter to be vertically integrated to build high density, fast access memory devices.

Processes described in the incorporated-by-reference Provisional Application Ser. Nos. 60/393,763 and 60/397,070 support poly-film TFT-SRAM cell and anti-fuse construction. This new usage differs from the process of FIG. 11 in doping levels and film thicknesses optimized for switch applications. The thin-film transistor construction and the Thin-Film Anti-Fuse construction may exist side by side with this Thin-Film Latch element if the design parameters overlap.

These processes can be used to fabricate a generic field programmable gate array (FPGA) with the inverters connecting to form latches and SRAM memory. Such memory in a TFT module may be replaced with hard wired connections to form an application specific integrated circuit (ASIC). Multiple ASICs can be fabricated with different variations of conductive patterns from the same FPGA. The memory circuit and the conductive pattern contain one or more substantially matching circuit characteristics. The process can be used to fabricate a high density generic static random access memory (SRAM) with inverters connecting to form latches and SRAM memory. A TFT module may be used to build a vertically integrated SRAM cell with one inverter on a substrate layer, and a second inverter in a TFT layer.

Although an illustrative embodiment of the present invention, and various modifications thereof, have been described in detail herein with reference to the accompanying drawings, it is to be understood that the invention is not limited to this precise embodiment and the described modifications, and that various changes and further modifications may be effected therein by one skilled in the art without departing from the scope or spirit of the invention as defined in the appended claims.

What is claimed is:

1. A method of fabricating a semiconductor CMOS switching device including:
   depositing, patterning and etching a first amorphous silicon majority carrier thin film layer on a substrate to form a contiguous first geometry;
   patterning and ion implantation to form an N-type and a P-type dopant implant region on the first geometry, the first geometry further comprising an implant boundary wherein the N-type and P-type implants are either adjacent to each other or over lap or merge;
   depositing a first dielectric layer;
   depositing a second amorphous silicon thin film layer;
   patterning and ion implantation to form N-type and P-type dopant implant second amorphous silicon regions;
   patterning and etching the second amorphous silicon layer to form a contiguous second geometry, the second geometry further comprising:
      an N-type implant region, said region fully crossing the first geometry region; and
      a P-type implant region, said region fully crossing the first geometry region; and
      an implant boundary wherein the N-type and P-type implants are either adjacent to each other or over lap or merge, said boundary occurring outside of the first geometry;
   cleaning and exposing the second geometry top surface and a portion of the first geometry top surface which includes the implant boundary not covered by the second geometry;
   depositing a metallic material for the purpose of silicide formation of first and second amorphous silicon material;
   providing silicide formation of the metallic material in the exposed surfaces, wherein:
      said second geometry surface including the implant boundary is silicided; and
      said exposed first geometry surface which includes the implant boundary region is silicided
   and wherein after etching said second amorphous silicon layer and prior to depositing said metallic material further including:
      patterning and ion implantation of N-type over N-type doped first geometry, and P-type over P-type doped first region to form source and drain regions;
      depositing a second dielectric layer; and
      etching the second dielectric layer to define dielectric spacer regions adjacent to the second geometry side walls.

2. The method of claim 1, including forming a P-type conducting and N-type conducting transistor pair by doping said first and second amorphous silicon regions.

3. The method of claim 1, including laser annealing of one or both of first and second geometry to form single crystal or polycrystalline silicon material.

4. The method of claim 1, wherein the substrate includes one of a semiconductor, polymer, metallic, insulator, glass, and composite material.

5. The method of claim 1, wherein the first dielectric region includes one of an oxide, an oxy-nitride, a nitride and any other insulating material.

6. The method of claim 1, wherein one or both of the first and second amorphous silicon layer thicknesses is less than or equal to thirty nano-meters.

7. The method of claim 3, wherein the laser anneal maintains a temperature less than or equal to four-hundred centigrade at the surface of the substrate layer.

8. The method of claim 1, wherein a said source and drain implant dose is greater than or equal to $2.0*10^{15}$ atoms per square centimeter.

9. A method of fabricating a majority carrier semiconductor thin film switching device, including:
   forming one or more metal lines on a substrate;
   depositing a first dielectric material to isolate the metal lines;
   planarizing the first dielectric surface;
   patterning and etching the first dielectric layer to form a first contact opening;
   depositing one or more barrier materials and a tungsten to fill the first contact;
   polishing the tungsten material to form a tungsten plug in a contact region;
   depositing a first amorphous silicon thin film layer;
   patterning, doping and etching the first amorphous silicon layer to form a first geometry having:
      an N-type and a P-type dopant implant region; and
      an implant boundary wherein the N-type and P-type implants are either adjacent to each other or over lap or merge; and
      a contacting region covering the first contact opening;
   depositing a second dielectric layer;
   patterning and ion implantation to form N-type and P-type dopant implant second amorphous silicon regions;
   patterning and etching the second amorphous silicon layer to form a contiguous second geometry, an etched region including a first contact region, the second geometry comprising:
      an N-type implant region fully crossing the first geometry; and
      a P-type implant region fully crossing the first geometry; and
      an implant boundary wherein the N-type and P-type implants are either adjacent to each other or over lap or merge, said boundary occurring outside of the first geometry;
   cleaning and exposing the second geometry top surface and a portion of the first geometry top surface not covered by the second geometry, the exposed portion including the implant boundary and the first contact regions;
   depositing a metallic material for the purpose of silicide formation of first and second amorphous silicon material;
   providing silicide formation of the metallic material in the exposed surfaces, wherein:
      said second geometry surface including the implant boundary is silicided; and said first geometry surface including the implant boundary and the first contact region is silicided and wherein after etching said second amorphous silicon layer and prior to depositing said metallic material further including:
  patterning and ion implantation of N-type over N-type doped first geometry, and P-type over P-type doped first region to form source and drain regions;
  depositing a second dielectric layer; and
  etching the second dielectric layer to define dielectric spacer regions adjacent to the second geometry side walls.

10. The method of claim 9, including forming a P-type conducting and N-type conducting transistor pair by doping said first and second amorphous silicon regions.

11. The method of claim 9, including laser annealing of one or both of first and second geometries to form single crystal or polycrystalline silicon material.

12. The method of claim 9, wherein the substrate includes one of a semiconductor, polymer, metallic, insulator, glass, and composite material.

13. The method of claim 9, wherein the second dielectric region includes one of an oxide, an oxy-nitride, a nitride and any other insulating material.

14. The method of claim 9, including patterning and etching the second dielectric layer after said second dielectric is deposited and prior to said second amorphous silicon deposition, the etched region further including a buried contact region over the first amorphous silicon geometry.

15. The method of claim 9, wherein after the second amorphous silicon layer is deposited and prior to depositing a third dielectric layer further including:
  depositing a spacer dielectric layer; and
  etching the spacer dielectric layer to define spacer dielectric regions adjacent to second geometry side walls.

16. The method of claim 9, wherein one or both of the first and second amorphous silicon layer thicknesses is less than or equal to thirty nano-meters.

17. The method of claim 11, wherein the laser anneal maintains a temperature less than or equal to four-hundred centigrade on the said one or more metal lines on the substrate.

18. A method of fabricating a low temperature semiconductor majority carrier thin film switching device, including:
  forming one or more metal lines on a substrate;
  forming a conductive contact to a said metal line thru an insulator layer above the metal lines;
  forming a thin film N-type and P-type conducting transistor pair having:
    a contiguous amorphous silicon first geometry above the insulator layer, said first geometry including an N-type transistor region, a P-type transistor region, and a common region between the transistor regions fully covering the contact; and
    a gate dielectric layer above the first geometry; and
    a contiguous amorphous silicon second geometry above the gate dielectric layer including transistor regions that cross over the first geometry transistor regions;
  forming a silicide of first and second amorphous silicon geometry surfaces with a deposited metallic material, the silicided surfaces including:
    said second geometry surface; and
    said first geometry surface not covered by the second geometry, which includes the surface of the region covering the contact;
  depositing an insulating material; and
  forming conductive contacts and top metal interconnects,
  and wherein after etching said second amorphous silicon layer and prior to depositing said metallic material further including:
    patterning and ion implantation of N-type over N-type doped first geometry, and P-type over P-type doped first region to form source and drain regions;
    depositing a second dielectric layer; and
    etching the second dielectric layer to define dielectric spacer regions adjacent to the second geometry side walls.

19. The method of claim 18, wherein the processing temperature is below four-hundred centigrade for forming said thin film devices and silicide.

* * * * *